(12) United States Patent
Khlat (10) Patent No.: US 11,088,658 B2
(45) Date of Patent: Aug. 10, 2021

(54) ENVELOPE TRACKING AMPLIFIER APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 16/514,339

(22) Filed: Jul. 17, 2019

(65) Prior Publication Data
US 2020/0295710 A1    Sep. 17, 2020

Related U.S. Application Data

(60) Provisional application No. 62/817,828, filed on Mar. 13, 2019.

(51) Int. Cl.
| | |
|---|---|
| *H03F 3/04* | (2006.01) |
| *H03F 1/02* | (2006.01) |
| *H03F 3/21* | (2006.01) |
| *H03F 1/32* | (2006.01) |
| *H04B 1/04* | (2006.01) |
| *H02M 3/07* | (2006.01) |

(52) U.S. Cl.
CPC ............ *H03F 1/0211* (2013.01); *H03F 1/32* (2013.01); *H03F 3/211* (2013.01); *H04B 1/04* (2013.01); *H02M 3/07* (2013.01); *H03F 1/0244* (2013.01); *H03F 2200/102* (2013.01); *H03F 2200/451* (2013.01)

(58) Field of Classification Search
CPC .......... H03F 1/0211; H03F 3/211; H03F 1/32; H03F 2200/102; H03F 2200/451; H03F 3/245; H03F 1/0244; H03F 2200/504; H03F 1/0227; H03F 1/305; H03F 3/04; H03F 2200/507; H04B 1/04; H04B 2001/0408; H02M 3/07; H03G 3/004; H03G 3/3042
USPC ......................................................... 330/297
See application file for complete search history.

(56) References Cited

U.S. PATENT DOCUMENTS

| | | | |
|---|---|---|---|
| 6,529,716 | B1 | 3/2003 | Eidson et al. |
| 6,788,151 | B2 | 9/2004 | Shvarts et al. |
| 8,019,289 | B2 | 9/2011 | Gorbachov |

(Continued)

OTHER PUBLICATIONS

Non-Final Office Action for U.S. Appl. No. 16/263,368, dated Dec. 26, 2019, 6 pages.

(Continued)

*Primary Examiner* — Khanh V Nguyen
(74) *Attorney, Agent, or Firm* — Withrow & Terranova, P.L.L.C.

(57) ABSTRACT

An envelope tracking (ET) amplifier apparatus is provided. In examples discussed herein, the ET amplifier apparatus can be configured to operate in a fifth-generation (5G) standalone (SA) mode and a 5G non-standalone (NSA) mode. In the SA mode, the ET amplifier apparatus can enable a first pair of amplifier circuits to amplifier a 5G signal for concurrent transmission in a 5G band(s). In the NSA mode, the ET amplifier apparatus can enable a second pair of amplifier circuits to amplify a non-5G anchor signal and a 5G signal for concurrent transmission in a non-5G anchor band(s) and a 5G band(s), respectively. As such, the ET circuit may be provided in a communication apparatus (e.g., a 5G-enabled smartphone) to help improve power amplifier linearity and efficiency in both 5G SA and NSA modes.

20 Claims, 6 Drawing Sheets

(56) References Cited

U.S. PATENT DOCUMENTS

| | | |
|---|---|---|
| 8,290,453 B2 | 10/2012 | Yoshihara |
| 8,385,859 B2 | 2/2013 | Hamano |
| 8,476,976 B2 | 7/2013 | Wimpenny |
| 8,598,950 B2 * | 12/2013 | Khesbak ............... H03F 1/56 330/51 |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,270,230 B2 | 2/2016 | Henshaw et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,387 B1 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 10,797,650 B2 * | 10/2020 | Khlat ............... H03F 3/68 |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 * | 6/2012 | Khesbak ............... H03F 1/0277 330/295 |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0111279 A1 | 4/2014 | Brobston |
| 2014/0218109 A1 * | 8/2014 | Wimpenny ............... H03F 3/19 330/251 |
| 2014/0306763 A1 | 10/2014 | Hong et al. |
| 2014/0306769 A1 | 10/2014 | Khlat et al. |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 * | 2/2016 | Khesbak ............... H03F 3/245 455/574 |
| 2016/0094185 A1 | 3/2016 | Shute |
| 2016/0094186 A1 | 3/2016 | Cohen |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 * | 8/2016 | Wimpenny ............... H03F 1/0222 |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222181 A1 | 7/2019 | Khlat |
| 2019/0267947 A1 | 8/2019 | Khlat et al. |
| 2019/0356285 A1 * | 11/2019 | Khlat ............... H03F 3/245 |
| 2020/0127625 A1 * | 4/2020 | Khlat ............... H03F 1/08 |
| 2020/0136575 A1 * | 4/2020 | Khlat ............... H03F 1/02 |
| 2020/0350878 A1 | 11/2020 | Drogi et al. |

OTHER PUBLICATIONS

Notice of Allowance for U.S. Appl. No. 16/273,288, dated Dec. 13, 2019, 8 pages.

Non-Final Office Action for U.S. Appl. No. 16/263,316, dated Dec. 23, 2019, 9 pages.

Notice of Allowance for U.S. Appl. No. 16/250,229, dated Sep. 22, 2020, 7 pages.

(56) References Cited

OTHER PUBLICATIONS

Non-Final Office Action for U.S. Appl. No. 16/263,316, dated Jul. 17, 2020, 4 pages.
Notice of Allowance for U.S. Appl. No. 16/278,886, dated Sep. 22, 2020, 8 pages.
Non-Final Office Action for U.S. Appl. No. 16/250,298, dated Aug. 20, 2020, 8 pages.
Non-Final Office Action for U.S. Appl. No. 16/263,368, dated Aug. 7, 2020, 4 pages.
Notice of Allowance for U.S. Appl. No. 16/193,513, dated Mar. 25, 2020, 8 pages.
Non-Final Office Action for U.S. Appl. No. 16/250,229, dated Apr. 29, 2020, 7 pages.
Non-Final Office Action for U.S. Appl. No. 16/267,740, dated Apr. 30, 2020, 10 pages.
Final Office Action for U.S. Appl. No. 16/263,316, dated May 13, 2020, 10 pages.
Notice of Allowance for U.S. Appl. No. 16/270,119, dated Jun. 18, 2020, 9 pages.
Non-Final Office Action for U.S. Appl. No. 16/278,886, dated Apr. 29, 2020, 9 pages.
Quayle Action for U.S. Appl. No. 16/267,779, dated May 1, 2020, 8 pages.
Final Office Action for U.S. Appl. No. 16/263,368, dated May 22, 2020, 9 pages.
Quayle Action for U.S. Appl. No. 16/267,740, mailed Oct. 19, 2020, 7 pages.
Non-Final Office Action for U.S. Appl. No. 16/263,316, dated Nov. 24, 2020, 4 pages.
Non-Final Office Action for U.S. Appl. No. 16/263,368, dated Dec. 17, 2020, 8 pages.
Notice of Allowance for U.S. Appl. No. 16/508,704, dated Dec. 30, 2020, 7 pages.
Notice of Allowance for U.S. Appl. No. 16/508,768, dated Oct. 27, 2020, 9 pages.
Notice of Allowance for U.S. Appl. No. 16/267,740, dated Mar. 3, 2021, 8 pages.
Notice of Allowance for U.S. Appl. No. 16/263,316, dated Mar. 30, 2021, 7 pages.
Quayle Action for U.S. Appl. No. 16/250,298, dated Feb. 3, 2021, 5 pages.
Notice of Allowance for U.S. Appl. No. 16/250,298, dated Apr. 15, 2021, 8 pages.
Non-Final Office Action for U.S. Appl. No. 16/689,236, dated Mar. 2, 2021, 15 pages.
Notice of Allowance for U.S. Appl. No. 16/263,368, dated Apr. 29, 2021, 7 pages.
Non-Final Office Action for U.S. Appl. No. 16/660,900, dated Feb. 18, 2021, 7 pages.
Notice of Allowance for U.S. Appl. No. 16/689,417, dated Feb. 24, 2021, 7 pages.
Notice of Allowance for U.S. Appl. No. 16/689,236, dated Jun. 9, 2021, 7 pages.
Non-Final Office Action for U.S. Appl. No. 16/669,728, dated Jun. 3, 2021, 9 pages.

\* cited by examiner

ENVELOPE TRACKING AMPLIFIER APPARATUS

RELATED APPLICATIONS

This application claims the benefit of U.S. provisional patent application Ser. No. 62/817,828, filed on Mar. 13, 2019, the disclosure of which is hereby incorporated herein by reference in its entirety.

FIELD OF THE DISCLOSURE

The technology of the disclosure relates generally to an envelope tracking (ET) power amplifier apparatus.

BACKGROUND

Fifth-generation (5G) new radio (NR) (5G-NR) has been widely regarded as the new generation of wireless communication technology beyond the current third-generation (3G) communication technology, such as wideband code division multiple access (WCDMA), and fourth-generation (4G) communication technology, such as long-term evolution (LTE). The 5G-NR wireless communication system is expected to provide a significantly higher data rate, improved coverage range, enhanced signaling efficiency, and reduced latency compared to wireless communication systems based on the 3G and 4G communication standards.

Notably, a 5G-NR wireless communication system may be deployed as a non-standalone (NSA) system or a standalone (SA) system. In an NSA system, a 5G-enabled wireless communication device (e.g., a smartphone) is configured to transmit and/or receive control information and data payloads in a non-5G anchor band (e.g., a 4G frequency band) and a 5G frequency band, respectively. In contrast, in a SA system, the 5G-enabled wireless communication device will communicate both control information and data payloads exclusively in the 5G frequency band.

Further, to achieve the higher data rate in the 5G-enabled wireless communication device, sophisticated power amplifiers (PAs) may be employed to increase output power of a 5G RF signal(s) communicated by the 5G-enabled wireless communication device. However, the increased output power of 5G RF signal(s) can lead to increased power consumption and thermal dissipation, thus compromising overall performance and user experiences. Envelope tracking (ET) is a power management technology designed to improve efficiency levels of PAs to help reduce power consumption and thermal dissipation in the 5G-enabled wireless communication device. In this regard, it may be desired to ensure that the 5G-enabled wireless communication device can enable ET power management in both the NSA system and the SA system.

SUMMARY

Embodiments of the disclosure relate to an envelope tracking (ET) amplifier apparatus and a related communication apparatus. In examples discussed herein, the ET amplifier apparatus can be configured to operate in a fifth-generation (5G) standalone (SA) mode and a 5G non-standalone (NSA) mode. In the SA mode, the ET amplifier apparatus can enable a first pair of amplifier circuits to amplify a 5G signal for concurrent transmission in a 5G band(s). In the NSA mode, the ET amplifier apparatus can enable a second pair of amplifier circuits to amplify a non-5G anchor signal and a 5G signal for concurrent transmission in a non-5G anchor band(s) and a 5G band(s), respectively. As such, the ET circuit may be provided in a communication apparatus (e.g., a 5G-enabled smartphone) to help improve power amplifier linearity and efficiency in both 5G SA and NSA modes.

In one aspect, an ET amplifier apparatus is provided. The ET amplifier apparatus includes a first distributed amplifier circuit configured to amplify a 5G signal based on a distributed ET voltage and a distributed ET current comprising a distributed alternate current and a distributed direct current for transmission in a first 5G band. The ET amplifier apparatus also includes a second distributed amplifier circuit configured to amplify the 5G signal based on the distributed ET voltage and the distributed ET current for transmission in a second 5G band. The ET amplifier apparatus also includes a distributed ET circuit. The distributed ET circuit includes a distributed port configured to receive the distributed direct current. The distributed ET circuit also includes a distributed voltage amplifier configured to generate the distributed ET voltage and the distributed alternating current. The distributed ET circuit also includes a distributed switch circuit configured to couple the distributed voltage amplifier and the distributed port to a selected distributed amplifier circuit among the first distributed amplifier circuit and the second distributed amplifier circuit to provide the distributed ET voltage, the distributed alternating current, and the distributed direct current to the selected distributed amplifier circuit in a SA mode or an NSA mode.

In another aspect, a communication apparatus is provided. The communication apparatus includes at least one first amplifier circuit configured to amplify a 5G signal based on an ET voltage for transmission in a first 5G band or a second 5G band in a SA mode. The communication apparatus also includes at least one second amplifier circuit configured to amplify a non-5G anchor signal based on the ET voltage for transmission in at least one non-5G anchor band in an NSA mode. The communication apparatus also includes an ET integrated circuit (ETIC) configured to generate and provide the ET voltage to the at least one first amplifier circuit and the at least one second amplifier circuit in the SA mode and the NSA mode, respectively. The communication apparatus also includes a first distributed amplifier circuit configured to amplify the 5G signal based on a distributed ET voltage for transmission in the first 5G band. The communication apparatus also includes a second distributed amplifier circuit configured to amplify the 5G signal for transmission in the second 5G band. The communication apparatus also includes a distributed ET circuit. The distributed ET circuit includes a distributed voltage amplifier configured to generate the distributed ET voltage. The distributed ET circuit also includes a distributed switch circuit configured to couple the distributed voltage amplifier to a selected distributed amplifier circuit among the first distributed amplifier circuit and the second distributed amplifier circuit to provide the distributed ET voltage to the selected distributed amplifier circuit in the SA mode and the NSA mode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) amplifier apparatus and a related communication apparatus. In examples discussed herein, the ET amplifier apparatus can be configured to operate in a fifth-generation (5G) standalone (SA) mode and a 5G non-standalone (NSA) mode. In the SA mode, the ET amplifier apparatus can enable a first pair of amplifier circuits to amplify a 5G signal for concurrent transmission in a 5G band(s). In the NSA mode, the ET amplifier apparatus can enable a second pair of amplifier circuits to amplify a non-5G anchor signal and a 5G signal for concurrent transmission in a non-5G anchor band(s) and a 5G band(s), respectively. As such, the ET circuit may be provided in a communication apparatus (e.g., a 5G-enabled smartphone) to help improve power amplifier linearity and efficiency in both 5G SA and NSA modes.

Figure 1:
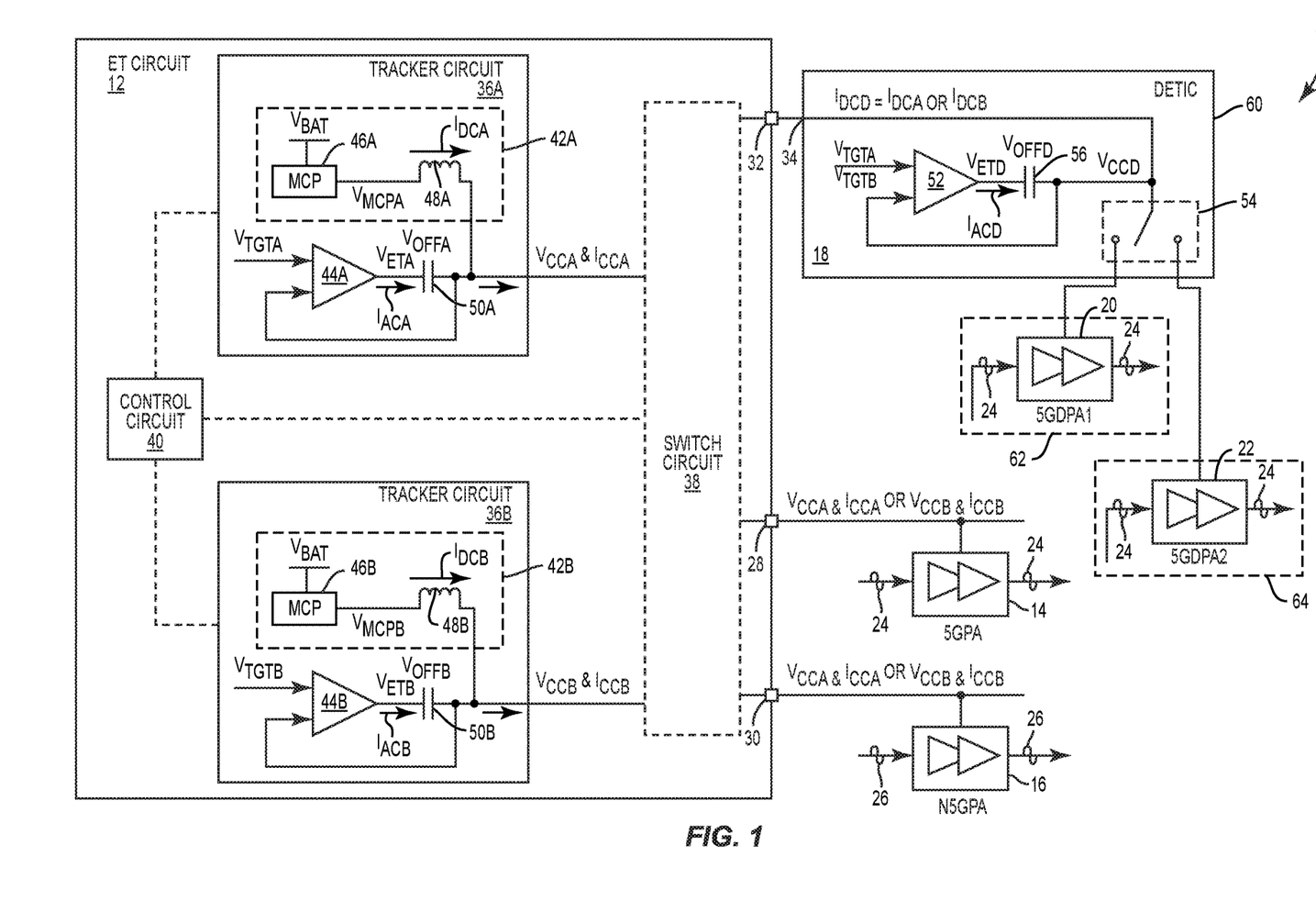
FIG. 1 is a schematic diagram of an exemplary envelope tracking (ET) amplifier apparatus configured according to an embodiment of the present disclosure to operate in both fifth-generation (5G) standalone (SA) and non-standalone (NSA) modes.

In this regard, FIG. 1 is a schematic diagram of an exemplary ET amplifier apparatus 10 configured according to an embodiment of the present disclosure to operate in both 5G SA and NSA modes. The ET amplifier apparatus 10 includes an ET integrated circuit (ETIC) 12, at least one first amplifier circuit 14 (denoted as "5GPA"), at least one second amplifier circuit 16 (denoted as "N5GPA"), and distributed ET circuit 18 (denoted as "DETIC"). The distributed ET circuit 18 may be coupled to a first distributed amplifier circuit 20 (denoted as "5GDPA1") and a second distributed amplifier circuit 22 (denoted as "5GDPA2").

In a non-limiting example, the first amplifier circuit 14, the first distributed amplifier circuit 20, and the second distributed amplifier circuit 22 are 5G amplifier circuits. The first distributed amplifier circuit 20 may be configured to amplify a 5G signal 24 for transmission in a first 5G band, such as 5G band n41 (2496-2690 MHz) for example. The second distributed amplifier circuit 22 may be configured to amplify the 5G signal 24 for transmission in a second 5G band, such as 5G band n77 (3300-4200 MHz) or 5G band n79 (4400-5000 MHz) for example. The first amplifier circuit 14 may be configured to amplify the 5G signal 24 for transmission in the first 5G band and/or the second 5G band.

In this regard, the first amplifier circuit 14 can be configured to amplify the 5G signal 24 concurrently to the first distributed amplifier circuit 20 or the second distributed amplifier circuit 22 for transmission in the first 5G band or the second 5G band in the SA mode. As such, the ET amplifier apparatus 10 may be configured to support 5G uplink multiple-input multiple-output (MIMO) in the SA mode. Notably, the ET amplifier apparatus 10 can include additional amplifier circuits and/or distributed amplifiers for amplifying the 5G signal 24 in additional 5G bands.

In another non-limiting example, the second amplifier circuit 16 is a non-5G amplifier circuit. The second amplifier circuit 16 may be configured to amplify a non-5G anchor signal 26 for transmission in at least one non-5G anchor band, such as a fourth-generation (4G) long-term evolution (LTE) band. In examples discussed herein, the second amplifier circuit 16 and the first distributed amplifier circuit 20 or the second distributed amplifier circuit 22 are configured to amplify the non-5G anchor signal 26 and the 5G signal 24 for concurrent transmission in the non-5G anchor band and the first 5G band or the second 5G band when the ET amplifier apparatus 10 operates in the NSA mode. In this regard, the non-5G anchor signal 26 may carry 5G control information and the 5G signal 24 may carry 5G data payloads in the NSA mode. Notably, the ET amplifier apparatus 10 can include additional non-5G amplifier circuits, such as second-generation (2G) and/or third-generation (3G) amplifier circuits for amplifying 2G and/or 3G signals. As such, the ET amplifier apparatus 10 can be backward compatible with legacy 2G and 3G networks.

The ETIC 12 includes at least one first port 28, at least one second port 30, and at least one third port 32 configured to be coupled to the first amplifier circuit 14, the second amplifier circuit 16, and a distributed port 34 in the distributed ET circuit 18, respectively. The ETIC 12 can include a first tracker circuit 36A and a second tracker circuit 36B. The first tracker circuit 36A is configured to generate a first ET voltage $V_{CCA}$ and a first ET current $I_{CCA}$, which consists of a first alternating current $I_{ACA}$ (also referred to as "higher-frequency current") and a first direct current $I_{DCA}$ (also referred to as "lower-frequency current"). The second tracker circuit 36B is configured to generate a second ET voltage $V_{CCB}$ and a second ET current $I_{CCB}$, which consists of a second alternating current $I_{ACB}$ (also referred to as "higher-frequency current") and a second direct current $I_{DCB}$ (also referred to as "lower-frequency current"). The ETIC 12 can include a switch circuit 38 coupled to the first tracker circuit 36A, the second tracker circuit 36B, the first port 28, the second port 30, and the third port 32. The ETIC 12 also includes a control circuit 40 coupled to the first tracker circuit 36A, the second tracker circuit 36B, and the switch circuit 38.

The first tracker circuit 36A includes a first charge pump circuit 42A and a first voltage amplifier 44A. The first charge pump circuit 42A includes a first multi-level charge pump (MCP) 46A and a first inductor 48A. The first MCP 46A is configured to generate a first constant voltage $V_{MCPA}$ at multiple levels based on a battery voltage $V_{BAT}$. In a non-limiting example, the first constant voltage $V_{MCPA}$ can be equal to zero-time of the battery voltage $V_{BAT}$ ($0 \times V_{BAT}$), one-time of the battery voltage $V_{BAT}$ ($1 \times V_{BAT}$), or two-times of the battery voltage $V_{BAT}$ ($2 \times V_{BAT}$). The first constant voltage $V_{MCPA}$ may cause the first inductor 48A to induce the first direct current $I_{DCA}$.

The first voltage amplifier 44A is configured to generate a first ET modulated voltage $V_{ETA}$ based on a first ET target voltage $V_{TGTA}$. The first voltage amplifier 44A may be coupled to a first offset capacitor 50A, which is configured to raise the first ET modulated voltage $V_{ETA}$ by a first offset voltage $V_{OFFA}$ (e.g., 0.8 V) to generate the first ET voltage $V_{CCA}$ ($V_{CCA}=V_{ETA}+V_{OFFA}$). Notably, the first ET target voltage $V_{TGTA}$ may correspond to a first time-variant target voltage envelope (not shown) that tracks (rises and falls) a time-variant power envelope (not shown) of the 5G signal 24 or a time-variant power envelope (not shown) of the non-5G anchor signal 26. Accordingly, the first voltage amplifier 44A is configured to generate the first ET voltage $V_{CCA}$ that rises and falls according to the first time-variant target voltage envelope of the first ET target voltage $V_{TGTA}$ and thus the time-variant power envelope of the 5G signal 24 or the time-variant power envelope of the non-5G anchor signal 26.

The first voltage amplifier 44A may also source the first alternating current $I_{ACA}$ that tracks the time-variant power envelope of the 5G signal 24 or the time-variant power envelope of the non-5G anchor signal 26. As such, the first alternating current $I_{ACA}$ can be referred to as an ET current. In contrast, the first direct current $I_{DCA}$ is configured to be relatively constant and thus does not rise and fall in accordance to the time-variant power envelope of the 5G signal 24 or the time-variant power envelope of the non-5G signal 26. As such, the first direct current $I_{DCA}$ can be referred to as a non-ET current. In this regard, the first tracker circuit 36A can be configured to generate the first ET current $I_{CCA}$ that includes the ET current $I_{ACA}$ and the non-ET current $I_{DCA}$ ($I_{CCA}=I_{ACA}+I_{DCA}$).

The second tracker circuit 36B includes a second charge pump circuit 42B and a second voltage amplifier 44B. The second charge pump circuit 42B includes a second MCP 46B and a second inductor 48B. The second MCP 46B is configured to generate a second constant voltage $V_{MCPB}$ at multiple levels based on a battery voltage $V_{BAT}$. In a non-limiting example, the second constant voltage $V_{MCPB}$ can be equal to $0 \times V_{BAT}$, $1 \times V_{BAT}$, or $2 \times V_{BAT}$. The second constant voltage $V_{MCPB}$ may cause the second inductor 48B to induce the second direct current $I_{DCB}$.

The second voltage amplifier 44B is configured to generate a second ET modulated voltage $V_{ETB}$ based on a second ET target voltage $V_{TGTB}$. The second voltage amplifier 44B may be coupled to a second offset capacitor 50B, which is configured to raise the second ET modulated voltage $V_{ETB}$ by a second offset voltage $V_{OFFB}$ (e.g., 0.8 V) to generate the second ET voltage $V_{CCB}$ ($V_{CCB}=V_{ETB}+V_{OFFB}$). Notably, the second ET target voltage $V_{TGTB}$ may correspond to a second time-variant target voltage envelope (not shown) that tracks (rises and falls) the time-variant power envelope of the 5G signal 24 or the time-variant power envelope of the non-5G anchor signal 26. Accordingly, the second voltage amplifier 44B is configured to generate the second ET voltage $V_{CCB}$ that rises and falls according to the second time-variant target voltage envelope of the second ET target voltage $V_{TGTB}$ and thus the time-variant power envelope of the 5G signal 24 or the time-variant power envelope of the non-5G anchor signal 26.

The second voltage amplifier 44B may also source the second alternating current $I_{ACB}$ that tracks the time-variant power envelope of the 5G signal 24 or the time-variant power envelope of the non-5G anchor signal 26. As such, the second alternating current $I_{ACB}$ can be referred to as an ET current. In contrast, the second direct current $I_{DCB}$ is configured to be relatively constant and thus does not rise and fall in accordance to the time-variant power envelope of the 5G signal 24 or the time-variant power envelope of the non-5G signal 26. As such, the second direct current $I_{DCB}$ can be referred to as a non-ET current. In this regard, the second tracker circuit 36B can be configured to generate the second ET current $I_{CCB}$ that includes the ET current $I_{ACB}$ and the non-ET current $I_{DCB}$ ($I_{CCB}=I_{ACB}+I_{DCB}$).

The distributed ET circuit 18 can be configured to include a distributed voltage amplifier 52 and a distributed switch circuit 54. The distributed voltage amplifier 52 is configured to generate a distributed ET modulated voltage $V_{ETD}$ based on the first ET target voltage $V_{TGTA}$ or the second ET target voltage $V_{TGTB}$, depending on which of the first ET target voltage $V_{TGTA}$ and the second ET target voltage $V_{TGTB}$ is configured to track the time-variant power envelope of the 5G signal 24. The distributed voltage amplifier 52 may be coupled to a distributed offset capacitor 56, which is configured to raise the distributed ET modulated voltage $V_{ETD}$ by an offset voltage $V_{OFFD}$ (e.g., 0.8 V) to generate a distributed ET voltage $V_{CCD}$ ($V_{CCD}=V_{ETD}+V_{OFFD}$) that tracks the time-variant power envelope of the 5G signal 24.

The distributed voltage amplifier 52 may also source a distributed alternating current $I_{ACD}$ that tracks the time-variant power envelope of the 5G signal 24. As such, the distributed alternating current $I_{ACD}$ can be referred to as an ET current. The distributed port 34 is configured to receive either the first direct current $I_{DCA}$ or the second direct current $I_{DCB}$ as the non-ET current. Accordingly, the distributed switch circuit 54 can be controlled, for example by the control circuit 40, to couple the distributed voltage amplifier 52 and the distributed port 34 to a selected distributed amplifier circuit among the first distributed amplifier circuit 20 and the second distributed amplifier circuit 22 in both the SA mode and the NSA mode. In this regard, the selected distributed amplifier circuit receives a distributed ET current $I_{CCD}$ that includes the distributed alternating current $I_{ACD}$ and a distributed direct current $I_{DCD}$ as one of the first direct current $I_{DCA}$ and the second direct current $I_{DCB}$ ($I_{CCD}=I_{ACD}+I_{DCD}$). Accordingly, the selected distributed amplifier circuit can amplify the 5G signal 24 for transmission in the first 5G band or the second 5G band based on the distributed ET voltage $V_{CCD}$ and the distributed ET current $I_{CCD}$. Given that the distributed ET circuit 18 only receives the first direct current $I_{DCA}$ or the second direct current $I_{DCB}$ from the ETIC 12, it may be possible for the distributed ET circuit 18 and the ETIC 12 to be coupled by a longer conductive trace without concerning about trace inductance associated with the conductive trace.

In one non-limiting example, in the SA mode, the control circuit 40 can be configured to couple the first voltage amplifier 44A and the first charge pump circuit 42A to the first port 28 to provide the first ET voltage $V_{CCA}$ and the first ET current $I_{CCA}$ to the first amplifier circuit 14. Accordingly, the first amplifier circuit 14 can amplify the 5G signal 24 based on the first ET voltage $V_{CCA}$ and the first ET current $I_{CCA}$. In this regard, the first ET target voltage $V_{TGTA}$ is configured to track the time-variant power envelope of the 5G signal 24. Therefore, the distributed voltage amplifier 52 in the distributed ET circuit 18 will be configured to generate the distributed voltage $V_{CCD}$ based on the first ET target voltage $V_{CCA}$. Concurrently, the control circuit 40 may couple the second charge pump circuit 42B to the third port 32 to provide the second DC $I_{DCB}$ to the distributed port 34 in the distributed ET circuit 18. Given that the distributed ET circuit 18 is capable of generating the distributed ET voltage $V_{CCD}$, the control circuit 40 may deactivate the second voltage amplifier 44B in the second tracker circuit 36B. The control circuit 40 may be further configured to decouple the second port 30 from the second charge pump circuit 42B, thus isolating an inherent impedance of the second amplifier circuit 16 from the ETIC 12.

In another non-limiting example, in the SA mode, the control circuit 40 can be configured to couple the second voltage amplifier 44B and the second charge pump circuit 42B to the first port 28 to provide the second ET voltage $V_{CCB}$ and the second ET current $I_{CCB}$ to the first amplifier circuit 14. Accordingly, the first amplifier circuit 14 can amplify the 5G signal 24 based on the second ET voltage $V_{CCB}$ and the second ET current $I_{CCB}$. In this regard, the second ET target voltage $V_{TGTB}$ is configured to track the time-variant power envelope of the 5G signal 24. Therefore, the distributed voltage amplifier 52 in the distributed ET circuit 18 will be configured to generate the distributed voltage $V_{CCD}$ based on the second ET target voltage $V_{CCB}$. Concurrently, the control circuit 40 may couple the first charge pump circuit 42A to the third port 32 to provide the first DC $I_{DCA}$ to the distributed port 34 in the distributed ET circuit 18. Given that the distributed ET circuit 18 is capable of generating the distributed ET voltage $V_{CCD}$, the control circuit 40 may deactivate the first voltage amplifier 44A in the first tracker circuit 36A. The control circuit 40 may be further configured to decouple the second port 30 from the second charge pump circuit 42B, thus isolating an inherent impedance of the second amplifier circuit 16 from the ETIC 12.

In another non-limiting example, in the NSA mode, the control circuit 40 can be configured to couple the first voltage amplifier 44A and the first charge pump circuit 42A to the second port 30 to provide the first ET voltage $V_{CCA}$ and the first ET current $I_{CCA}$ to the second amplifier circuit 16. Accordingly, the second amplifier circuit 16 can amplify the non-5G signal 26 based on the first ET voltage $V_{CCA}$ and the first ET current $I_{CCA}$. In this regard, the first ET target voltage $V_{TGTA}$ is configured to track the time-variant power envelope of the non-5G signal 26. Therefore, the distributed voltage amplifier 52 in the distributed ET circuit 18 will be configured to generate the distributed voltage $V_{CCD}$ based on the first ET target voltage $V_{CCA}$. Concurrently, the control circuit 40 may couple the second charge pump circuit 42B to the third port 32 to provide the second DC $I_D$cg to the distributed port 34 in the distributed ET circuit 18. Given that the distributed ET circuit 18 is capable of generating the distributed ET voltage $V_{CCD}$, the control circuit 40 may deactivate the second voltage amplifier 44B in the second tracker circuit 36B. The control circuit 40 may be further configured to decouple the first port 28 from the second charge pump circuit 42B, thus isolating an inherent impedance of the first amplifier circuit 14 from the ETIC 12.

In another non-limiting example, in the NSA mode, the control circuit 40 can be configured to couple the second voltage amplifier 44B and the second charge pump circuit 42B to the second port 30 to provide the second ET voltage $V_{CCB}$ and the second ET current $I_{CCB}$ to the second amplifier circuit 16. Accordingly, the second amplifier circuit 16 can amplify the non-5G signal 26 based on the second ET voltage $V_{CCB}$ and the second ET current $I_{CCB}$. In this regard, the first ET target voltage $V_{TGTA}$ is configured to track the time-variant power envelope of the non-5G signal 26. Therefore, the distributed voltage amplifier 52 in the distributed ET circuit 18 will be configured to generate the distributed voltage $V_{CCD}$ based on the first ET target voltage $V_{CCA}$. Concurrently, the control circuit 40 may couple the first charge pump circuit 42A to the third port 32 to provide the first DC $I_{DCA}$ to the distributed port 34 in the distributed ET circuit 18. Given that the distributed ET circuit 18 is capable of generating the distributed ET voltage $V_{CCD}$, the control circuit 40 may deactivate the first voltage amplifier 44A in the first tracker circuit 36A. The control circuit 40 may be further configured to decouple the first port 28 from the first charge pump circuit 42A, thus isolating an inherent impedance of the first amplifier circuit 14 from the ETIC 12.

Figure 2:
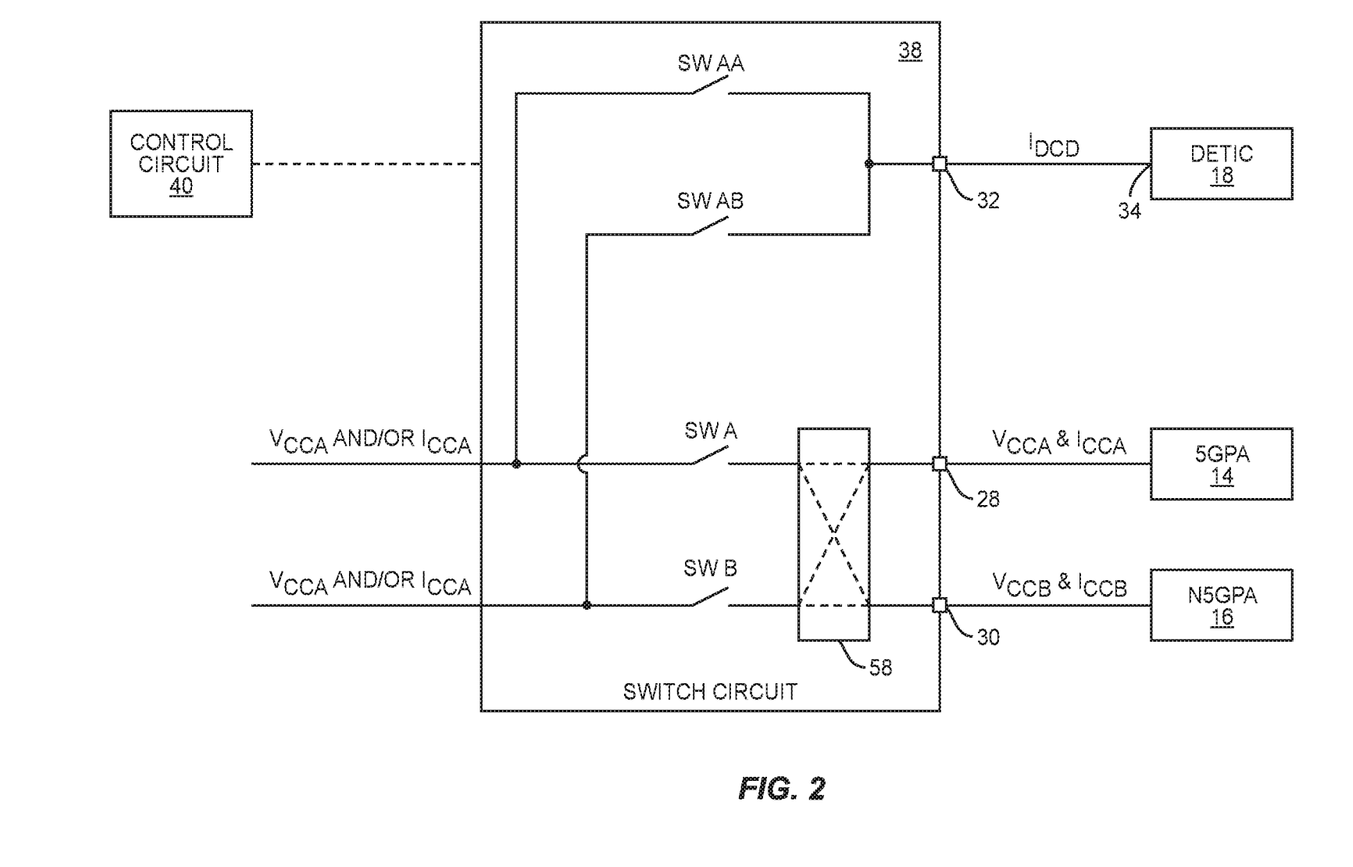
FIG. 2 is a schematic diagram of an exemplary switch circuit that can be provided in the ET amplifier apparatus of FIG. 1 to enable a dual-mode (SA and NSA) operation.

The control circuit 40 may be configured to selectively couple the first tracker circuit 36A and the second tracker circuit 36B to the first port 28, the second port 30, and the third port 32 via the switch circuit 38. In this regard, FIG. 2 is a schematic diagram providing an exemplary illustration of the switch circuit 38 in the ETIC 12 of FIG. 1. Common elements between FIGS. 1 and 2 are shown therein with common element numbers and will not be re-described herein.

In a non-limiting example, the switch circuit 38 includes a first switch SWA, a second switch SWB, a first auxiliary switch SWAA, and a second auxiliary switch SWBB. The switch circuit 38 may also include switching circuitry 58, which can be controlled to couple the first switch SWA to any of the first port 28 and the second port 30 or to couple the second switch SWB to any of the first port 28 and the second port 30. The switching circuitry 58 may be configured to include any number and/or type of switches without affecting the above-mentioned functionality of the switching circuitry 58.

In a non-limiting example, in the SA mode, the control circuit 40 may close the first switch SWA to couple the first tracker circuit 36A to the first port 28 to provide the first ET voltage $V_{CCA}$, the first direct current $I_{DCA}$, and the first alternating current $I_{ACA}$ to the first amplifier circuit 14. Concurrently, the control circuit 40 may open the first auxiliary switch SWAA and close the second auxiliary switch SWBB to couple the second tracker circuit 36B to the third port 32 to provide the second direct current $I_{DCB}$ to the distributed port 34 in the distributed ET circuit 18. In addition, the control circuit 40 may open the second switch SWB to decouple the second port 30 from the first tracker circuit 36A and the second tracker circuit 36B.

In another non-limiting example, in the SA mode, the control circuit 40 may close the second switch SWB to couple the second tracker circuit 36B to the first port 28 to provide the second ET voltage $V_{CCB}$, the second direct current $I_{DCB}$, and the second alternating current $I_{ACB}$ to the first amplifier circuit 14. Concurrently, the control circuit 40 may close the first auxiliary switch SWAA and open the second auxiliary switch SWAB to couple the first tracker circuit 36A to the third port 32 to provide the first direct current $I_{DCA}$ to distributed port 34 in the distributed ET circuit 18. In addition, the control circuit 40 may open the second switch SWB to decouple the second port 30 from the first tracker circuit 36A and the second tracker circuit 36B.

In another non-limiting example, in the NSA mode, the control circuit 40 may close the first switch SWA to couple the first tracker circuit 36A to the second port 30 to provide the first ET voltage $V_{CCA}$, the first direct current $I_{DCA}$, and the first alternating current $I_{ACA}$ to the second amplifier circuit 16. Concurrently, the control circuit 40 may open the first auxiliary switch SWAA and close the second auxiliary switch SWBB to couple the second tracker circuit 36B to the third port 32 to provide the second direct current $I_{DCB}$ to the distributed port 34 in the distributed ET circuit 18. In addition, the control circuit 40 may open the first switch SWA to decouple the first port 28 from the first tracker circuit 36A and the second tracker circuit 36B.

In another non-limiting example, in the NSA mode, the control circuit 40 may close the second switch SWB to couple the second tracker circuit 36B to the second port 30 to provide the second ET voltage $V_{CCB}$, the second direct current $I_{DCB}$, and the second alternating current $I_{ACB}$ to the second amplifier circuit 16. Concurrently, the control circuit 40 may close the first auxiliary switch SWAA and open the second auxiliary switch SWBB to couple the first tracker circuit 36A to the third port 32 to provide the first direct current $I_{DCA}$ to the distributed port 34 in the distributed ET circuit 18. In addition, the control circuit 40 may open the first switch SWA to decouple the first port 28 from the first tracker circuit 36A and the second tracker circuit 36B.

Notably, the switch circuit 38 as illustrated in FIG. 2 is merely a non-limiting example. It should be appreciated that the switch circuit 38 can be configured based on any number, type, and topology of switches to carried out the above-described functions.

With reference back to FIG. 1, in a non-limiting example, the distributed ET circuit 18, the first distributed amplifier circuit 20, and the second distributed amplifier circuit 22 can be provided in a first distributed printed circuit board (PCB) 60, a second distributed PCB 62, and a third distributed PCB 64, respectively. The first distributed PCB 60, the second distributed PCB 62, and the third distributed PCB 64 are different PCBs separated from each other. Notably, it may also be possible to provide the distributed ET circuit 18, the first distributed amplifier circuit 20, and the second distributed amplifier circuit 22 in the ET amplifier apparatus 10 in accordance to different configurations, as discussed next in FIGS. 3A, 3B, and 3C. Common elements between FIGS. 1 and 3A-3C are shown therein with common element numbers and will not be re-described herein.

Figure 3A:
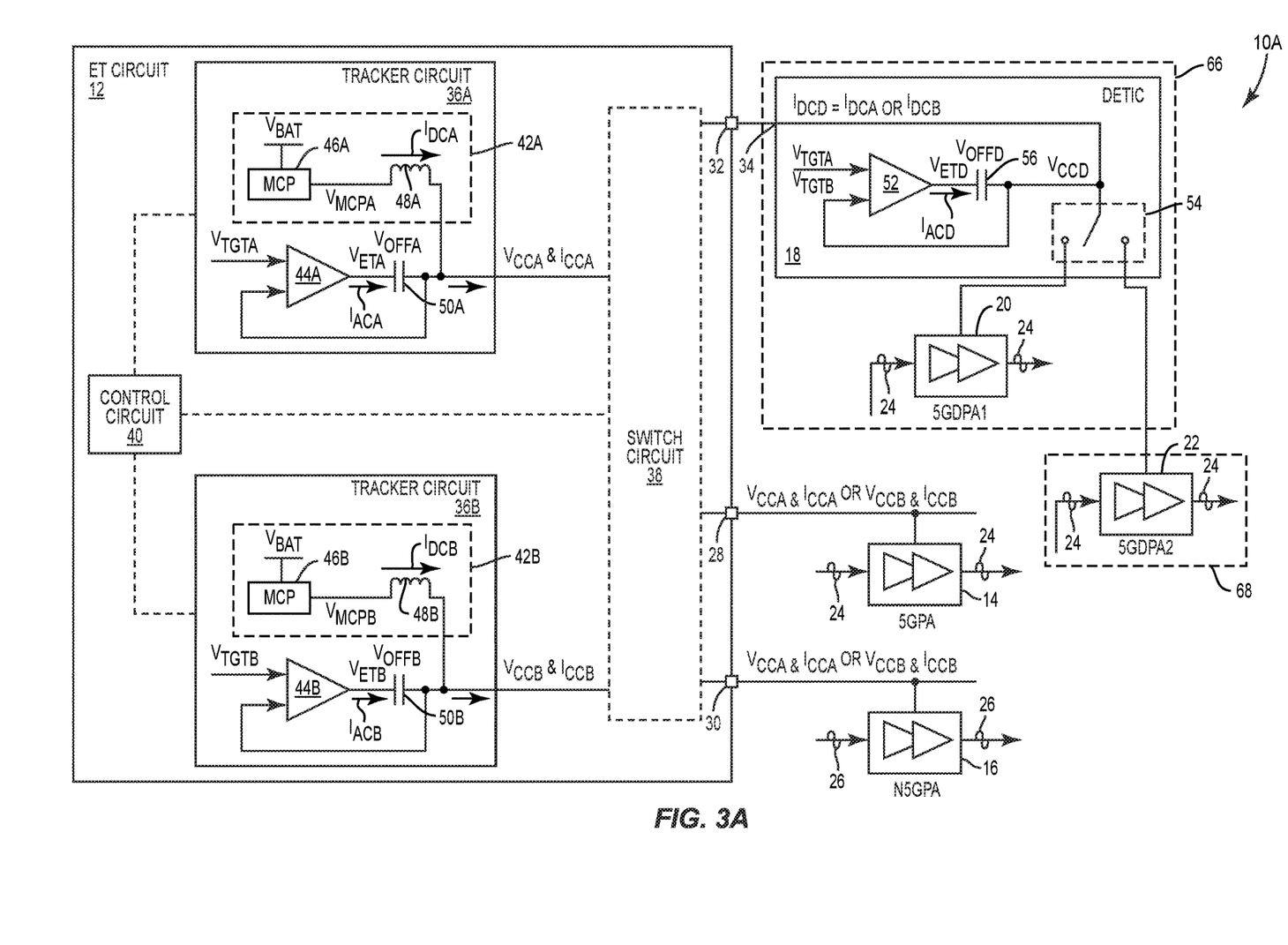
FIG. 3A is a schematic diagram of an exemplary ET amplifier apparatus configured according to another embodiment of the present disclosure.

FIG. 3A is a schematic diagram of an exemplary ET amplifier apparatus 10A configured according to another embodiment of the present disclosure. In a non-limiting example, the distributed ET circuit 18 and the first distributed amplifier circuit 20 are provided in a first distributed PCB 66, while the second distributed amplifier circuit 22 is provided in a second distributed PCB 68. The first distributed PCB 66 and the second distributed PCB 62 are different PCBs separated from each other.

Figure 3B:
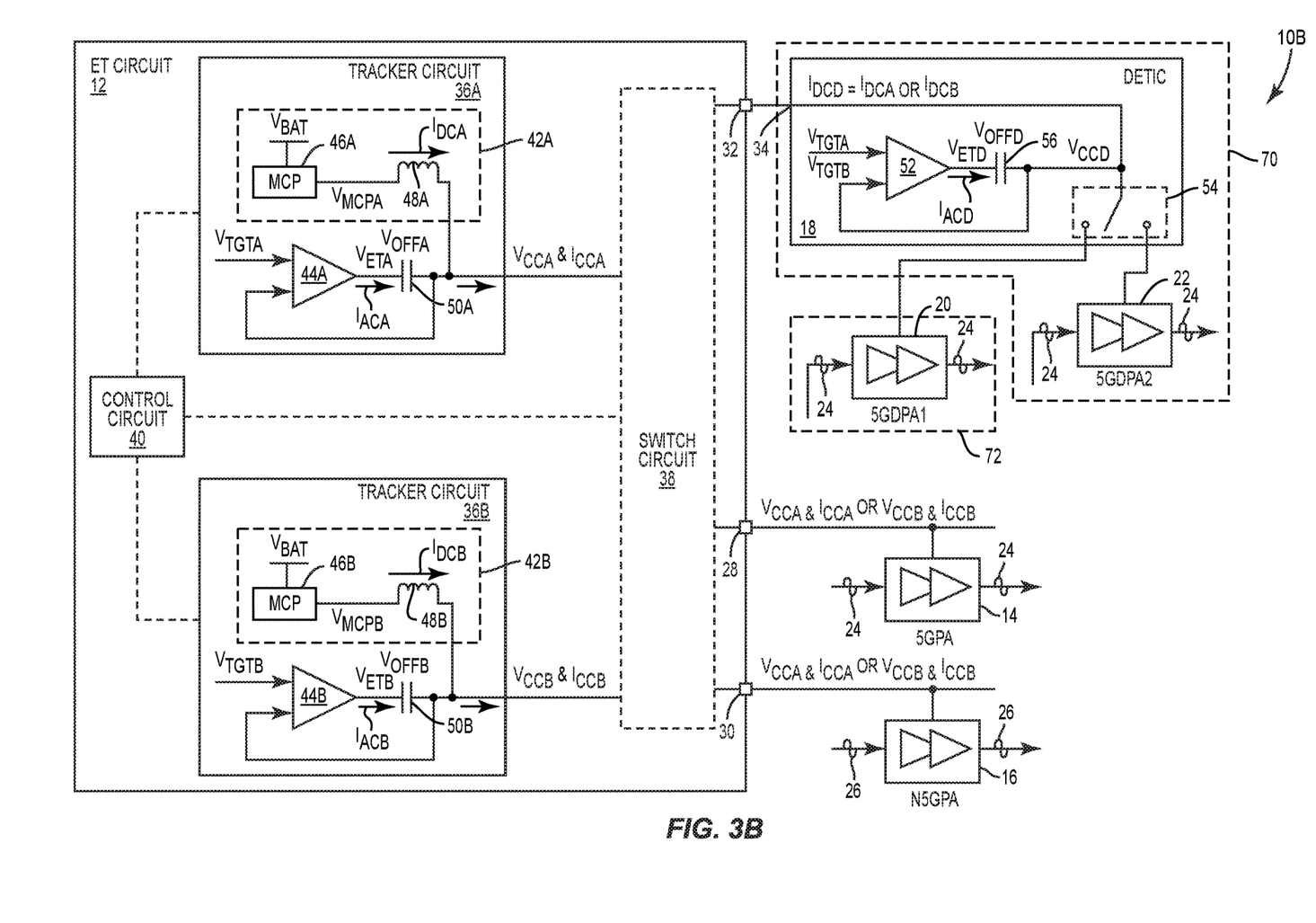
FIG. 3B is a schematic diagram of an exemplary ET amplifier apparatus configured according to another embodiment of the present disclosure.

FIG. 3B is a schematic diagram of an exemplary ET amplifier apparatus 10B configured according to another embodiment of the present disclosure. In a non-limiting example, the distributed ET circuit 18 and the second distributed amplifier circuit 22 are provided in a first distributed PCB 70, while the first distributed amplifier circuit 20 is provided in a second distributed PCB 72. The first distributed PCB 70 and the second distributed PCB 72 are different PCBs separated from each other.

Figure 3C:
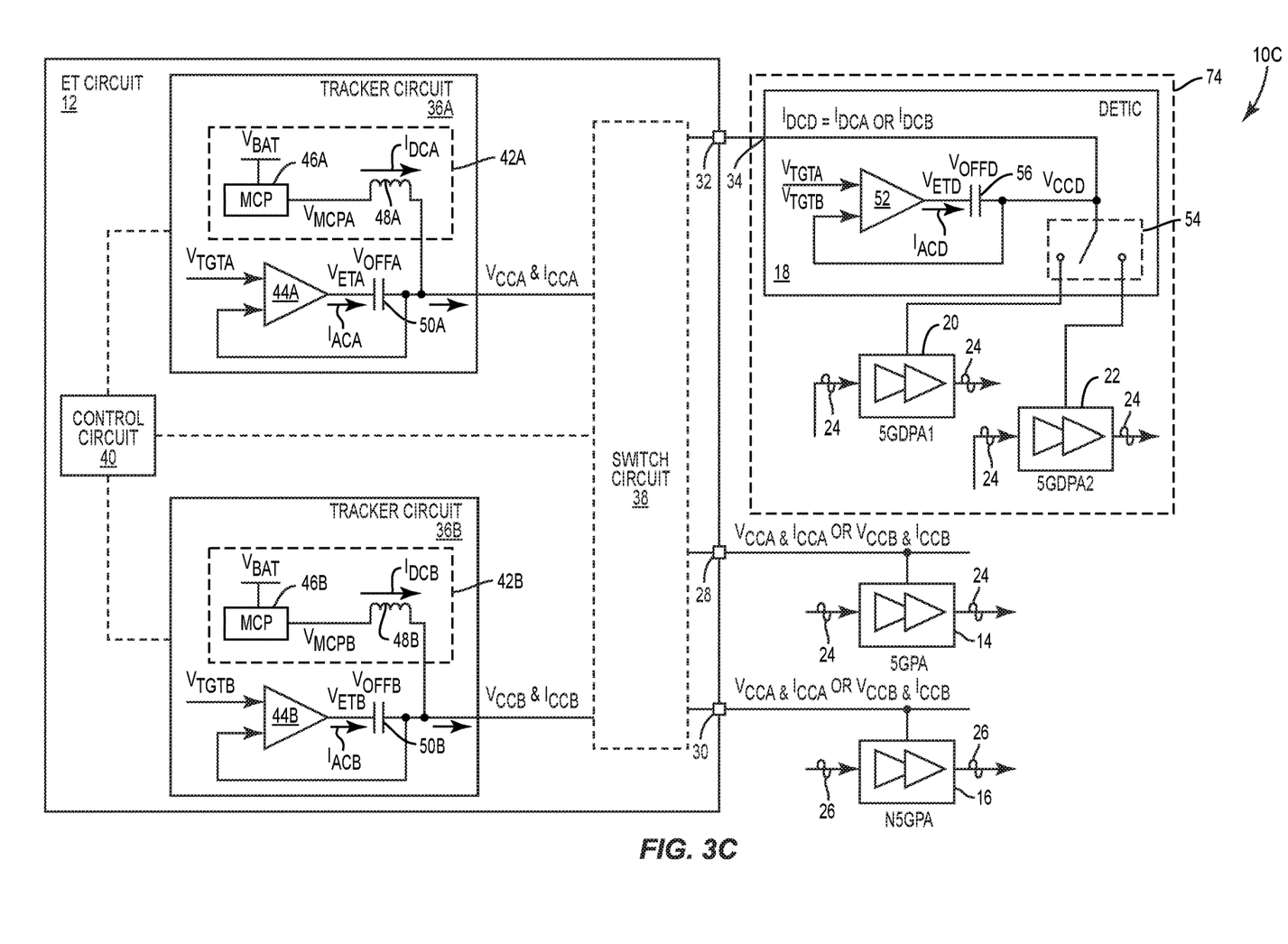
FIG. 3C is a schematic diagram of an exemplary ET amplifier apparatus configured according to another embodiment of the present disclosure.

FIG. 3C is a schematic diagram of an exemplary ET amplifier apparatus 10C configured according to another embodiment of the present disclosure. In a non-limiting example, the distributed ET circuit 18, the first distributed amplifier circuit 20, and the second distributed amplifier circuit 22 are integrated into a single distributed PCB 74.

Figure 4:
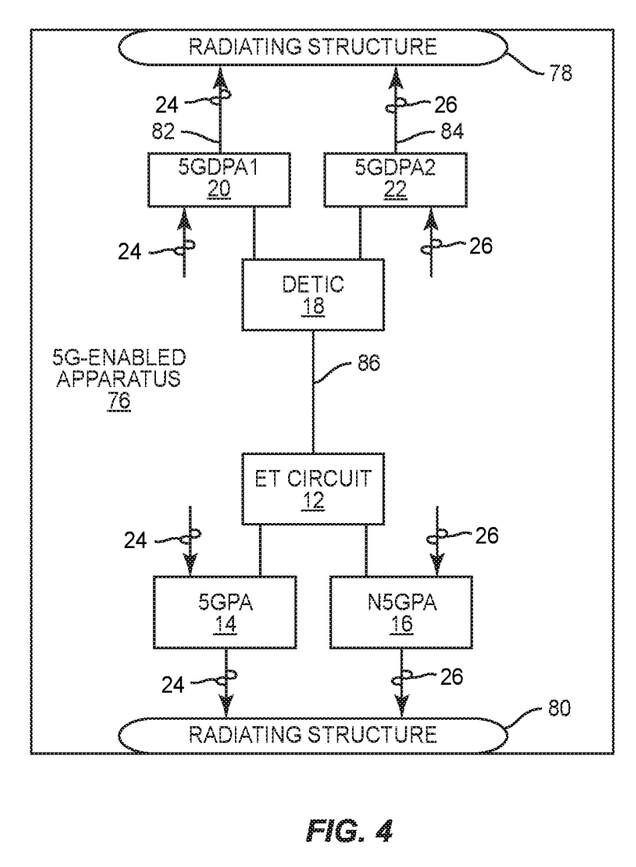
FIG. 4 is a schematic diagram of an exemplary communication apparatus incorporating the ET amplifier apparatus of FIGS. 1 and 3A-3C.

The ET amplifier apparatus 10 of FIG. 1, the ET amplifier apparatus 10A of FIG. 3A, the ET amplifier apparatus 10B of FIG. 3B, and the ET amplifier apparatus 10C of FIG. 3C can be provided in a communication apparatus (e.g., a 5G-enabled smartphone) to enable ET function in the SA and the NSA modes. In this regard, FIG. 4 is a schematic diagram of an exemplary communication apparatus 76 incorporating the ET amplifier apparatus 10 of FIG. 1, the ET amplifier apparatus 10A of FIG. 3A, the ET amplifier apparatus 10B of FIG. 3B, or the ET amplifier apparatus 10C of FIG. 3C. Common elements between FIGS. 1 and 4 are shown therein with common element numbers and will not be re-described herein.

The communication apparatus 76 includes a first radiating structure 78 (e.g., a first antenna) and a second radiating structure 80 (e.g., a second antenna). The first radiating structure 78 may be provided on one edge (e.g., top edge) of the communication apparatus 76 and the second radiating structure 80 may be provided on an opposing edge (e.g., bottom edge) of the communication apparatus 76.

In a non-limiting example, the first distributed amplifier circuit 20 and the second distributed amplifier circuit 22 can be provided closer to the first radiating structure 78 than to the second radiating structure 80. The distributed ET circuit 18 may be provided in close proximity to the first distributed amplifier circuit 20 and the second distributed amplifier circuit 22 via a first distributed conductive trace 82 and a second distributed conductive trace 84, respectively. Herein, the distributed ET circuit 18 is said to be in close proximity to the first distributed amplifier circuit 20 when the first distributed conductive trace 82 corresponds to a respective trace inductance that is below a defined threshold (e.g., 0.1 nH). Likewise, the distributed ET circuit 18 is said to be in close proximity to the second distributed amplifier circuit 22 when the second distributed conductive trace 84 corresponds to a respective trace inductance that is below the defined threshold.

In contrast, the ETIC 12, the first amplifier circuit 14, and the second amplifier circuit 16 may be provided closer to the second radiating structure 80 than to the first radiating structure 78. The distributed ET circuit 18 may be coupled to the ETIC 12 via a conductive trace 86, which is longer than each of the first distributed conductive trace 82 and the second distributed conductive trace 84. As discussed earlier, the ETIC 12 is only configured to provide either the first direct current $I_{DCA}$ or the second direct current $I_{DCB}$ to the distributed ET circuit 18. As such, an inherent trace inductance associated with the conductive trace 86 may have very little impact on the distributed ET circuit 18.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) amplifier apparatus comprising:
   a first distributed amplifier circuit configured to amplify a fifth-generation (5G) signal based on a distributed ET voltage and a distributed ET current, wherein the distributed ET current comprises a distributed alternating current and a distributed direct current for transmission in a first 5G band;
   a second distributed amplifier circuit configured to amplify the 5G signal based on the distributed ET voltage and the distributed ET current for transmission in a second 5G band; and
   a distributed ET circuit comprising:
      a distributed port configured to receive the distributed direct current;
      a distributed voltage amplifier configured to generate the distributed ET voltage and the distributed alternating current; and
      a distributed switch circuit configured to couple the distributed voltage amplifier and the distributed port to a selected distributed amplifier circuit among the first distributed amplifier circuit and the second distributed amplifier circuit to provide the distributed ET voltage, the distributed alternating current, and the distributed direct current to the selected distributed amplifier circuit in a standalone (SA) mode or a non-standalone (NSA) mode.

2. The ET amplifier apparatus of claim 1, further comprising:
   a first distributed printed circuit board (PCB) comprising the distributed ET circuit;
   a second distributed PCB comprising the first distributed amplifier circuit; and
   a third distributed PCB comprising the second distributed amplifier circuit;
   wherein the first distributed PCB, the second distributed PCB, and the third distributed PCB are configured to be separate PCBs.

3. The ET amplifier apparatus of claim 1, further comprising:
   a first distributed printed circuit board (PCB) comprising the distributed ET circuit and the first distributed amplifier circuit; and
   a second distributed PCB comprising the second distributed amplifier circuit;
   wherein the first distributed PCB and the second distributed PCB are configured to be separate PCBs.

4. The ET amplifier apparatus of claim 1, further comprising:
   a first distributed printed circuit board (PCB) comprising the distributed ET circuit and the second distributed amplifier circuit; and
   a second distributed PCB comprising the first distributed amplifier circuit,
   wherein the first distributed PCB and the second distributed PCB are configured to be separate PCBs.

5. The ET amplifier apparatus of claim 1, further comprising a distributed printed circuit board (PCB) comprising the distributed ET circuit, the first distributed amplifier circuit, and the second distributed amplifier circuit.

6. The ET amplifier apparatus of claim 1, further comprising:
   at least one first amplifier circuit configured to amplify the 5G signal based on an ET voltage, an alternating current, and a direct current for transmission in the first 5G band or the second 5G band in the SA mode;
   at least one second amplifier circuit configured to amplify a non-5G anchor signal based on the ET voltage, the alternating current, and the direct current for transmission in at least one non-5G anchor band in the NSA mode; and
   an ET integrated circuit (ETIC) comprising:
      at least one first port coupled to the at least one first amplifier circuit;
      at least one second port coupled to the at least one second amplifier circuit;
      at least one third port coupled to the distributed port in the distributed ET circuit;
      a first tracker circuit comprising:
         a first voltage amplifier configured to generate a first ET voltage and a first alternating current; and
         a first charge pump circuit configured to generate a first direct current; and
      a second tracker circuit comprising:
         a second voltage amplifier configured to generate a second ET voltage and a second alternating current; and
         a second charge pump circuit configured to generate a second direct current.

7. The ET amplifier apparatus of claim 6, wherein the ETIC further comprises:
a switch circuit coupled to the first tracker circuit, the second tracker circuit, the at least one first port, the at least one second port, and the at least one third port; and
a control circuit configured to:
control the switch circuit to couple a first selected tracker circuit among the first tracker circuit and the second tracker circuit to the at least one first port in the SA mode, wherein:
a respective one of the first voltage amplifier and the second voltage amplifier in the first selected tracker circuit is configured to provide a respective one of the first ET voltage and the second ET voltage and a respective one of the first alternating current and the second alternating current to the at least one first port; and
a respective one of the first charge pump circuit and the second charge pump circuit in the first selected tracker circuit is configured to provide a respective one of the first direct current and the second direct current to the at least one first port;
control the switch circuit to couple the first selected tracker circuit to the at least one second port in the NSA mode, wherein:
the respective one of the first voltage amplifier and the second voltage amplifier in the first selected tracker circuit is configured to provide the respective one of the first ET voltage and the second ET voltage and the respective one of the first alternating current and the second alternating current to the at least one second port; and
the respective one of the first charge pump circuit and the second charge pump circuit in the first selected tracker circuit is configured to provide the respective one of the first direct current and the second direct current to the at least one second port; and
control the switch circuit to couple a second selected tracker circuit among the first tracker circuit and the second tracker circuit to the at least one third port in the SA mode and the NSA mode, wherein a respective one of the first charge pump circuit and the second charge pump circuit in the second selected tracker circuit is configured to provide a respective one of the first direct current and the second direct current to the at least one third port.

8. The ET amplifier apparatus of claim 7, wherein the control circuit is further configured to deactivate a respective one of the first voltage amplifier and the second voltage amplifier in the second selected tracker circuit in the SA mode and the NSA mode.

9. The ET amplifier apparatus of claim 7, wherein, in the SA mode, the control circuit is further configured to:
couple the first voltage amplifier and the first charge pump circuit to the at least one first port to provide the first ET voltage, the first alternating current, and the first direct current as the ET voltage, the alternating current, and the direct current, respectively, to the at least one first amplifier circuit; and
couple the second charge pump circuit to the at least one third port to provide the second direct current as the distributed direct current to the distributed port in the distributed ET circuit.

10. The ET amplifier apparatus of claim 9, wherein the control circuit is further configured to deactivate the second voltage amplifier and decouple the second charge pump circuit from the at least one second port.

11. The ET amplifier apparatus of claim 7, wherein, in the SA mode, the control circuit is further configured to:
couple the second voltage amplifier and the second charge pump circuit to the at least one first port to provide the second ET voltage, the second alternating current, and the second direct current as the ET voltage, the alternating current, and the direct current, respectively, to the at least one first amplifier circuit; and
couple the first charge pump circuit to the at least one third port to provide the first direct current as the distributed direct current to the distributed port in the distributed ET circuit.

12. The ET amplifier apparatus of claim 11, wherein the control circuit is further configured to deactivate the first voltage amplifier and decouple the first charge pump circuit from the at least one second port.

13. The ET amplifier apparatus of claim 7, wherein, in the NSA mode, the control circuit is further configured to:
couple the first voltage amplifier and the first charge pump circuit to the at least one second port to provide the first ET voltage, the first alternating current, and the first direct current as the ET voltage, the alternating current, and the direct current, respectively, to the at least one second amplifier circuit; and
couple the second charge pump circuit to the at least one third port to provide the second direct current as the distributed direct current to the distributed port in the distributed ET circuit.

14. The ET amplifier apparatus of claim 13, wherein the control circuit is further configured to deactivate the second voltage amplifier and decouple the second charge pump circuit from the at least one first port.

15. The ET amplifier apparatus of claim 7, wherein, in the NSA mode, the control circuit is further configured to:
couple the second voltage amplifier and the second charge pump circuit to the at least one second port to provide the second ET voltage, the second alternating current, and the second direct current as the ET voltage, the alternating current, and the direct current, respectively, to the at least one second amplifier circuit; and
couple the first charge pump circuit to the at least one third port to provide the first direct current as the distributed direct current to the distributed port in the distributed ET circuit.

16. The ET amplifier apparatus of claim 15, wherein the control circuit is further configured to deactivate the first voltage amplifier and decouple the first charge pump circuit from the at least one first port.

17. A communication apparatus comprising:
at least one first amplifier circuit configured to amplify a fifth-generation (5G) signal based on an envelope tracking (ET) voltage for transmission in a first 5G band or a second 5G band in a standalone (SA) mode;
at least one second amplifier circuit configured to amplify a non-5G anchor signal based on the ET voltage for transmission in at least one non-5G anchor band in a non-standalone (NSA) mode;
an ET integrated circuit (ETIC) configured to generate and provide the ET voltage to the at least one first amplifier circuit and the at least one second amplifier circuit in the SA mode and the NSA mode, respectively;
a first distributed amplifier circuit configured to amplify the 5G signal based on a distributed ET voltage for transmission in the first 5G band;

a second distributed amplifier circuit configured to amplify the 5G signal for transmission in the second 5G band; and a distributed ET circuit comprising:
  a distributed voltage amplifier configured to generate the distributed ET voltage; and
  a distributed switch circuit configured to couple the distributed voltage amplifier to a selected distributed amplifier circuit among the first distributed amplifier circuit and the second distributed amplifier circuit to provide the distributed ET voltage to the selected distributed amplifier circuit in the SA mode and the NSA mode.

18. The communication apparatus of claim 17, wherein the distributed ET circuit is provided in close proximity to each of the first distributed amplifier circuit and the second distributed amplifier circuit to reduce a respective trace inductance to below a defined threshold.

19. The communication apparatus of claim 17, wherein the ETIC comprises:
  at least one first port coupled to the at least one first amplifier circuit;
  at least one second port coupled to the at least one second amplifier circuit;
  at least one third port coupled to the distributed ET circuit;
  a first tracker circuit comprising:
    a first voltage amplifier configured to generate a first ET voltage and a first alternating current; and
    a first charge pump circuit configured to generate a first direct current;
  a second tracker circuit comprising:
    a second voltage amplifier configured to generate a second ET voltage and a second alternating current; and
    a second charge pump circuit configured to generate a second direct current;
  a switch circuit coupled to the first tracker circuit, the second tracker circuit, the at least one first port, the at least one second port, and the at least one third port; and
  a control circuit configured to:
    control the switch circuit to couple a first selected tracker circuit among the first tracker circuit and the second tracker circuit to the at least one first port in the SA mode, wherein:
      a respective one of the first voltage amplifier and the second voltage amplifier in the first selected tracker circuit is configured to provide a respective one of the first ET voltage and the second ET voltage and a respective one of the first alternating current and the second alternating current to the at least one first port; and
      a respective one of the first charge pump circuit and the second charge pump circuit in the first selected tracker circuit is configured to provide a respective one of the first direct current and the second direct current to the at least one first port;
    control the switch circuit to couple the first selected tracker circuit to the at least one second port in the NSA mode, wherein:
      the respective one of the first voltage amplifier and the second voltage amplifier in the first selected tracker circuit is configured to provide the respective one of the first ET voltage and the second ET voltage and the respective one of the first alternating current and the second alternating current to the at least one second port; and
      the respective one of the first charge pump circuit and the second charge pump circuit in the first selected tracker circuit is configured to provide the respective one of the first direct current and the second direct current to the at least one second port; and
    control the switch circuit to couple a second selected tracker circuit among the first tracker circuit and the second tracker circuit to the at least one third port in the SA mode and the NSA mode, wherein a respective one of the first charge pump circuit and the second charge pump circuit in the second selected tracker circuit is configured to provide a respective one of the first direct current and the second direct current to the at least one third port.

20. The communication apparatus of claim 19, wherein the control circuit is further configured to deactivate a respective one of the first voltage amplifier and the second voltage amplifier in the second selected tracker circuit in the SA mode and the NSA mode.

* * * * *